United States Patent
Yu et al.

(10) Patent No.: US 9,874,316 B2
(45) Date of Patent: Jan. 23, 2018

(54) LIGHTING ASSEMBLY, A LIGHT SOURCE AND A LUMINAIRE

(71) Applicant: KONINKLIJKE PHILIPS N.V., Eindhoven (NL)

(72) Inventors: Jianghong Yu, Best (NL); Giovanni Cennini, Eindhoven (NL)

(73) Assignee: PHILIPS LIGHTING HOLDING B.V., Eindhoven (NL)

( * ) Notice: Subject to any disclaimer, the term of this patent is extended or adjusted under 35 U.S.C. 154(b) by 217 days.

(21) Appl. No.: 14/370,345

(22) PCT Filed: Dec. 21, 2012

(86) PCT No.: PCT/IB2012/057596
§ 371 (c)(1),
(2) Date: Jul. 2, 2014

(87) PCT Pub. No.: WO2013/102823
PCT Pub. Date: Jul. 11, 2013

(65) Prior Publication Data
US 2014/0369045 A1 Dec. 18, 2014

Related U.S. Application Data

(60) Provisional application No. 61/582,560, filed on Jan. 3, 2012.

(51) Int. Cl.
*F21S 4/00* (2016.01)
*F21K 99/00* (2016.01)
(Continued)

(52) U.S. Cl.
CPC .................. *F21K 9/30* (2013.01); *F21K 9/00* (2013.01); *F21K 9/20* (2016.08); *F21V 29/004* (2013.01);
(Continued)

(58) Field of Classification Search
CPC .................................... F21K 9/00; F21K 9/30
See application file for complete search history.

(56) References Cited

U.S. PATENT DOCUMENTS

| 7,710,045 B2 | 5/2010 | Schultz et al. |
| 2002/0010245 A1 | 1/2002 | Enami et al. |
| (Continued) | | |

FOREIGN PATENT DOCUMENTS

| CN | 201502903 U | 6/2009 |
| KR | 2009062422 A | 6/2009 |
| (Continued) | | |

*Primary Examiner* — Evan Dzierzynski

(57) ABSTRACT

A lighting assembly, a light source and a luminaire are provided. The lighting assembly 100 comprises a primary thermal layer 112, a plurality of Lighting Emitting Diode assemblies 106 and a plurality of wires 102. The primary thermal layer 112 is of a thermally conductive material. The wires 102 are electrically coupled between electrodes 108, 114 of at least two different Light Emitting Diode assemblies 106. The Light Emitting Diode assemblies 106 comprise a sub-mount 110, a first and a second metal electrode 108, 114 and a Light Emitting Diode die 116. The sub-mount 110 is of a thermally conductive and electrically insulating ceramic. The sub-mount 110 has a first side which is thermally coupled to the primary thermal layer 112 and has a second side being opposite the first side. The first and the second metal electrode 108, 114 are arranged at the second side of the sub-mount 10. The Light Emitting Diode die 116 is electrically and thermally coupled with an anode of the Light Emitting Diode to the first metal electrode and with a cathode of the Light Emitting Diode to the second metal electrode.

13 Claims, 5 Drawing Sheets

(51) Int. Cl.
*F21K 9/00* (2016.01)
*F21V 29/00* (2015.01)
*F21K 9/20* (2016.01)
*H05K 1/02* (2006.01)
*H05K 3/00* (2006.01)
*H01L 33/64* (2010.01)
*F21Y 115/10* (2016.01)

(52) U.S. Cl.
CPC ......... *F21Y 2115/10* (2016.08); *H01L 33/641* (2013.01); *H01L 2224/48137* (2013.01); *H05K 1/0209* (2013.01); *H05K 3/0061* (2013.01); *H05K 2201/1053* (2013.01); *H05K 2201/10106* (2013.01)

(56) References Cited

U.S. PATENT DOCUMENTS

| | | | |
|---|---|---|---|
| 2004/0252503 A1 | 12/2004 | Lin | |
| 2006/0098438 A1* | 5/2006 | Ouderkirk | H05K 1/0203 362/294 |
| 2006/0289887 A1 | 12/2006 | Bui et al. | |
| 2008/0033519 A1* | 2/2008 | Burwell | A61N 5/0601 607/122 |
| 2008/0074871 A1 | 3/2008 | Meis et al. | |
| 2009/0101921 A1 | 4/2009 | Lai | |
| 2009/0250709 A1 | 10/2009 | Chang et al. | |
| 2010/0109039 A1 | 5/2010 | Kim | |
| 2010/0214777 A1* | 8/2010 | Suehiro | F21S 4/008 362/235 |
| 2010/0220472 A1* | 9/2010 | Dahm | A61C 19/004 362/231 |
| 2010/0259930 A1* | 10/2010 | Yan | F21K 9/00 362/235 |
| 2010/0277914 A1 | 11/2010 | Bachl et al. | |
| 2010/0327750 A1* | 12/2010 | Tsao | F21K 9/17 315/113 |

FOREIGN PATENT DOCUMENTS

| | | |
|---|---|---|
| WO | 2006103596 A2 | 10/2006 |
| WO | 2007122566 A1 | 11/2007 |

* cited by examiner

LIGHTING ASSEMBLY, A LIGHT SOURCE AND A LUMINAIRE

This application is the U.S. National Phase application under 35 U.S.C. § 371 of International Application No. PCT/IB12/057596, filed on Dec. 21, 2012, which claims the benefit of [e.g., U.S. Provisional Patent Application No. or European Patent Application No.] 61/582,560, filed on Jan. 3, 2012. These applications are hereby incorporated by reference herein.

FIELD OF THE INVENTION

The invention relates to illumination assemblies comprising Light Emitting Diodes.

BACKGROUND OF THE INVENTION

Published U.S. Pat. No. 7,710,045B2 discloses an illumination assembly comprising a plurality of Light Emitting Diode (LEDs) dies. The illumination assembly comprises a substrate which comprises a first electrically conductive layer, a layer of an electrically insulating material which comprises thermal conductive particles, and a second layer of an electrically conductive material. The first electrically conductive layer is a patterned layer thereby forming a plurality of metal tracks acting as current conductors. In one embodiment, a bottom surface of the LED dies are electrically and thermally coupled to a single metal track of the first electrically conductive layer and are electrically coupled to another metal track with a wire bond that is coupled to a top surface of the LED dies. Wire bonds are relatively small and do not conduct heat well. In another embodiment, the LED dies have at one surface two areas for being coupled to an electrical source, and these two areas are electrically and thermally coupled to two different metal tracks of the first electrically conductive layer. The thermal coupling of LED dies to metal tracks of the first electrically conductive layer allows the heat generated in the LED dies to be transferred to the first electrically conductive layer. The layer of the electrically insulating material, which comprises thermal conductive particles, transfers a significant portion of the heat towards the second layer of electrically conductive material. The second layer of the electrically conductive material may be a metal, which is a thermal conductor. The second layer may be used to couple the illumination assembly to a heat sink. If no heat sink is coupled to the second layer of the electrically conductive material, the second layer transfers heat to the ambient of the lighting assembly.

The transport of heat from the LED dies towards the ambient and/or a heat sink being coupled to the second layer is not high enough for all applications, especially not when high power LEDs are used.

SUMMARY OF THE INVENTION

It is an object of the invention to provide a lighting assembly which provides a better cooling of the LED dies.

A first aspect of the invention provides a lighting assembly. A second aspect of the invention provides a light source. A third embodiment of the invention provides a luminaire. Advantageous embodiments are defined in the dependent claims.

A lighting assembly in accordance with the first aspect of the invention comprises a primary thermal layer, a plurality of Lighting Emitting Diode assemblies and a plurality of wires. The primary thermal layer is of a thermally conductive material. The wires are electrically coupled between electrodes of at least two different Light Emitting Diode assemblies. The Light Emitting Diode assemblies comprise a sub-mount, a first and a second metal electrode and a Light Emitting Diode die. The sub-mount is of a thermally conductive and electrically insulating ceramic. The sub-mount has a first side which is thermally coupled to the primary thermal layer and has a second side being opposite the first side. The first and the second metal electrode are arranged at the second side of the sub-mount. The Light Emitting Diode die is electrically and thermally coupled with an anode of the Light Emitting Diode to the first metal electrode and with a cathode of the Light Emitting Diode to the second metal electrode.

The lighting assembly according to the first aspect provides an advantageous cooling of the Light Emitting Diode (LED) dies. The LED dies are thermally coupled to the electrodes which receive a significant portion of the heat that is generated in the LED dies. The electrodes conduct a portion of the heat towards the wires which act as a heat sink and which provide heat to the ambient of the wires. The electrodes are also applied to the second surface of the sub-mount, and, thus, a significant portion of the heat is transferred via the electrodes and the sub-mount towards the primary thermal layer. The primary thermal layer functions as a heat sink for the LED assemblies. The primary thermal layer spreads heat in a lateral direction and transfers most of the heat towards the ambient of the primary thermal layer. The primary thermal layer may also be thermally coupled to another heat sink, such as a cooling fin, or an active heat dissipation means, such as, for example, a Peltier element. The primary thermal layer is not electrically connected to any one of the LED dies and is, therefore, shared among the plurality of LED assemblies and has, as such, a relatively large surface for transferring heat towards the ambient. Further, because the primary thermal layer is not electrically coupled to voltages applied to the LED dies, the primary thermal layer may be coupled to a heat sink without using additional electrical insulation means, which would inherently reduce the thermal conductivity of a thermal path from the primary thermal layer towards the heat sink.

Thus, the lighting assembly according to the invention has several thermal paths from the LED die towards the ambient such that heat can be transferred efficiently and effectively towards the ambient. Consequently, the LED dies are well cooled.

Optionally, the primary thermal layer is a metal. In another option, the primary thermal layer is, for example, graphene, which is also a good thermal conductor.

Optionally, the wires are arranged in an imaginary plane, wherein the imaginary plane does not intersect with the primary thermal layer. Thus, the wires are not electrically connected to the primary thermal layer. It is to be noted that the imaginary plane is not necessarily a completely flat plane—the plane may also be curved, for example, if the primary thermal layer is curved as well. It is only relevant that the wires are not in contact with the primary thermal layer when the primary thermal layer is electrically conductive.

Optionally, the imaginary plane does not extend above a top surface of the Light Emitting Diode dies seen in a direction away from the primary thermal layer along an imaginary line perpendicular to the primary thermal layer. Thus, the light emission of the LED dies is not hindered by the wires.

Optionally, the wires are arranged parallel to the primary thermal layer.

Optionally, the lighting assembly further comprises a secondary thermal material which is thermally conductive and electrically insulating. The secondary thermal material is thermally coupled to the primary thermal layer. The secondary thermal material is arranged in between a subset of the plurality of sub-mounts and in between a subset of the plurality of corresponding Light Emitting Diode dies. The secondary thermal material encapsulates a subset of the plurality of wires. The secondary thermal material provides an additional thermal path for conducting heat towards the primary thermal layer. Heat of the LED dies may follow a thermal path from the electrodes, via the wires, via the secondary thermal material towards the primary thermal layer. Consequently, heat is better transferred towards the primary thermal layer and, thus, the LED dies are better cooled. The secondary thermal material further electrically isolates the wires in between the LED assemblies.

Optionally, the secondary thermal material does not extend beyond a top surface of the Light Emitting diodes dies seen in a direction away from the primary thermal layer along an imaginary line perpendicular to the primary thermal layer. Thus, the light emission of the LED dies is not hindered by the secondary thermal material.

Optionally, the secondary thermal material further encapsulates a subset of a plurality of solder joints between wires and electrodes. Thus, an even better thermal pad is obtained from the LED die towards the primary thermal layer. If all wires and solder joints are encapsulated, the lighting assembly may be used at high voltages because a good electrical insulation is provided. It is to be noted that, in optional embodiment, the secondary thermal material does not touch the LED dies.

Optionally, the secondary thermal material comprises Silicone filled with thermally conductive electrically insulating particles. The optional material provides a relatively good thermal conductivity and a good electrical insulation. Further, the Silicone is flexible which is advantageous if the lighting assembly is bent. The Silicone material may further be provided to the lighting assembly by injection thereby automatically filling the spaces in between the LED assemblies. The secondary thermal material is a material that is flexible and has to reflect impinging light. When other materials than Silicone are used, such as rubber, Polyurethane and Polybutadiene, the surface of the secondary thermal material on which light is impinging must be provided with a light reflective layer.

Optionally, the thermally conductive electrically insulating particles comprise at least one of Boron Nitride hexagonal Boron Nitride, $Al_2O_3$, $ZnO$ and $TiO_2$ particles. Boron Nitride particles are advantageous thermally conductive and electrically insulating particles and, thus, results in a relatively high thermal conductivity for the secondary thermal material. Further, Boron Nitride has a white appearance and reflects visible light relatively well. Thus, if light emitted by the LED dies impinges on the secondary thermal material, the impinging light is reflected and not absorbed. Thus, the Boron Nitride does not reduce the optical efficiency of the lighting assembly. Further, the Silicone filled with Boron Nitride is a relatively good thermal black body, which means that the secondary thermal material radiates heat in the form of electromagnetic waves in the infrared spectral range if it becomes relatively warm. Thus, the secondary thermal material does not only provide a relatively good thermal pad towards the primary thermal layer, but transfers also a portion of the heat towards the ambient of the lighting assembly.

Optionally, the primary thermal layer comprises copper and/or the electrodes comprise copper. Copper has a relatively high thermal conductivity and is a good electrical conductor. Thus, the copper contributes to a better cooling of the LED dies, and the electrodes of copper do not reduce the electrical efficiency of the lighting assembly. Optionally, the primary thermal layer is a layer of copper. Optionally, the electrodes are of copper.

Optionally, the primary thermal layer is flexible. If the primary thermal layer is flexible, the lighting assembly as a whole is relatively flexible. Thus, it may be used in applications wherein a flexible or curved light engine is required. Optionally, the primary thermal layer is thicker than 70 micrometer. If the primary thermal layer is thick enough, it spread heat well in a lateral direction.

Especially if the primary thermal layer is a copper layer which is relatively thin, for example, thinner than one millimeter, the lighting assembly may be bended to obtain a required shape.

Optionally, the LED assemblies are separated from each other. It means that the LED assemblies do not touch each other. Either an air gap is present between them or a, possibly, flexible material is arranged between them. If the LED assemblies are arranged too close to each other, the lighting assembly is not flexible enough.

Optionally, the Light Emitting Diode die is a flip-chip Light Emitting Diode die. The flip-chip Light Emitting Diode die has the anode and the cathode at a surface of the Light Emitting Diode die. The flip-chip Light Emitting Diode die is arranged with the surface towards the electrodes. Thus, the flip-chip LED is directly thermally and electrically coupled to the electrodes. A relatively good thermal path is provided towards the electrodes and no additional wire bonds are required. The anode or cathode of certain other types of LED dies need to be electrically coupled by an additional wire bond which is then present in the light emitting path of the LED and, thus, contributes to the optical inefficiency of a system using such types of LEDs. According to this optional embodiment such an optical inefficiency is prevented.

Optionally, the sub-mount comprises Aluminium Oxide or Aluminium Nitride. Ceramic sub-mounts which comprise AlO or AlN are good thermal conductors and are also good electrical insulators.

According to a second aspect of the invention, a light source comprises the lighting assembly according to the first aspect of the invention.

Optionally, the light sources further comprise a transparent tube and the lighting assembly is arranged inside the transparent tube.

According to a third aspect of the invention, a luminaire is provided which comprises the lighting assembly according to the first aspect of the invention, or comprises the light source according to the second aspect of the invention.

The light source according to the second aspect of the invention and the luminaire according to the third aspect of the invention provide the same benefits as the lighting assembly according to the first aspect of the invention and have similar embodiments with similar effects as the corresponding embodiments of the lighting assembly.

These and other aspects of the invention are apparent from and will be elucidated with reference to the embodiments described hereinafter.

It will be appreciated by those skilled in the art that two or more of the above-mentioned options, implementations, and/or aspects of the invention may be combined in any way deemed useful.

Modifications and variations of the assembly, the light source and/or the luminaire, which correspond to the described modifications and variations of the assembly, can be carried out by a person skilled in the art on the basis of the present description.

Figure 1:
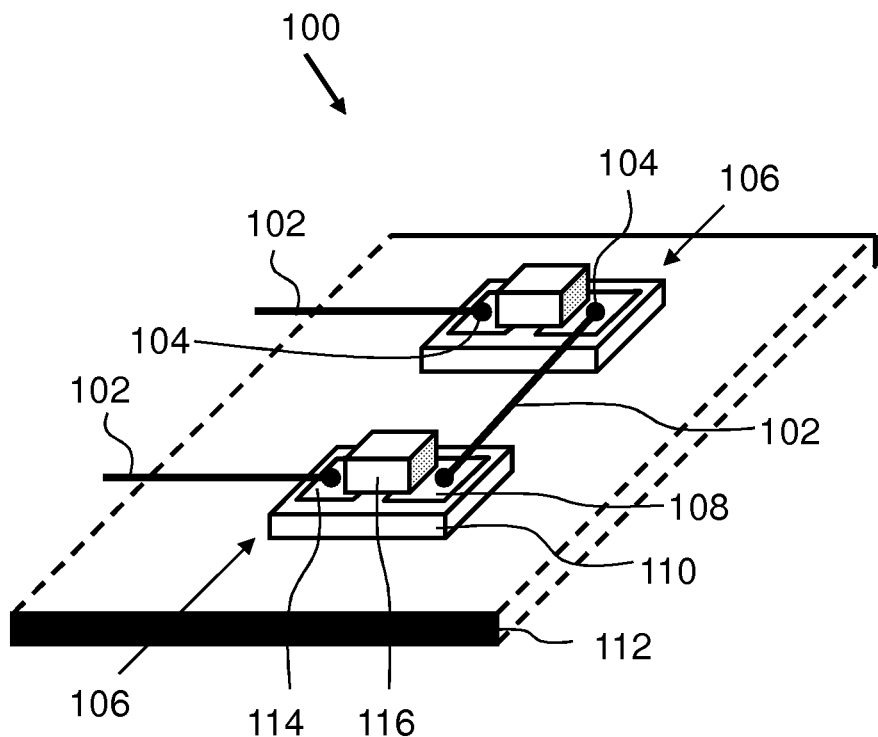
FIG. 1 schematically shows a three dimensional view of a lighting assembly according to the first aspect of the invention, FIG. 2a schematically shows a cross-section of the lighting assembly according to the first aspect of the invention, FIG. 2b schematically shows a cross-section of another embodiment of the lighting assembly, FIG. 3 schematically shows a cross-section of a further embodiment of the lighting assembly, FIG. 4 schematically shows a cross-section of a light source according to the second aspect of the invention, and FIG. 5 schematically shows an interior of a room comprising two luminaires according to the third aspect of the invention.

It should be noted that items denoted by the same reference numerals in different Figures have the same structural features and the same functions, or are the same signals. Where the function and/or structure of such an item have been explained, there is no necessity for repeated explanation thereof in the detailed description.

The Figures are purely diagrammatic and not drawn to scale. Particularly for clarity, some dimensions are exaggerated strongly.

DETAILED DESCRIPTION

A first embodiment is shown in FIG. 1. FIG. 1 schematically shows a three dimensional view of a lighting assembly 100 according to the first aspect of the invention. The lighting assembly 100 comprises a primary thermal layer 112 of a metal. On the primary thermal layer are arranged a plurality of Light Emitting Diode (LED) assemblies 106. Wires 102 are arranged between the LED assemblies 106. The LED assemblies 106 comprise a ceramic sub-mount 110, a first and a second electrode 108, 114 arranged on a surface of the ceramic sub-mount 110, and a LED die 116. The ceramic sub-mount 110 is thermally conductive and electrically insulating. The ceramic sub-mount 110 has a first side being thermally coupled to the primary thermal layer 112 and has a second side being opposite the first side. The first electrode 108 and the second electrode 114 are arranged on the second side of the ceramic sub-mount 110. The first electrode 108 and the second electrode 114 are layers of a metal that is electrically and thermally conductive. The LED die 116 has a cathode and an anode, and, the specific LED die 116 of FIG. 1 has the cathode and the anode at a single surface of the LED die. The cathode and the anode are electrically and thermally coupled to, respectively, the first electrode 108 and the second electrode 114. Thus, LED die 116 is brought in contact with the two electrodes 108, 114. The wires 102 are coupled between electrodes of different LED assemblies by solder joints 104. The LED dies 116 are called flip-chips. Other LED dies may be used as well, for example, a LED die which has to be brought in contact with one electrode with one of their surfaces and a wire bond has to be arranged in between another surface of the LED die and another electrode.

If the LED dies 116 receive power via the wires 102 and electrode 108, 114, the LED dies 116 emit light in a direction away from the lighting assembly. During the generation of light, the LED dies 116 become relatively hot. To prevent that the LED dies 116 become defective, their heat must be transported away from the LED dies 116. A relatively small portion will be transferred directly to the ambient via radiation and convection, e.g. to the surrounding air. A relatively large portion is conducted towards the first electrode 108 and the second electrode 114. The first electrode 108 and the second electrode 114 are manufactured of a metal and, as such, are relatively good thermal conductors. The electrodes 108, 114 spread the heat in a lateral direction and conduct most of the heat towards the ceramic sub-mount 110 which is especially designed to conduct most of the heat towards the primary thermal layer 112. The primary thermal layer 112 is a metal and, as such, a relatively good thermal conductor. The heat is conducted and spread in the lateral direction by the primary thermal layer 112 and the relatively large surface of the primary thermal layer 112 transfers a lot of heat to the ambient (air) via radiation, convection and conduction.

The ceramic sub-mount 110 is comprises Aluminium Oxide or Aluminium Nitride. Sub-mounts 110 which comprise these materials are in general good thermal conductors.

The wires 102 may have any shape in cross-section, such as a square or circular cross-section. Furthermore, they may be relatively thick such that they do conduct heat relatively well and such that they have a low electrical resistance.

In an alternative embodiment, the primary thermal layer is not made of metal but of another material that conducts heat relatively well, such as grapheme.

Figure 2A:
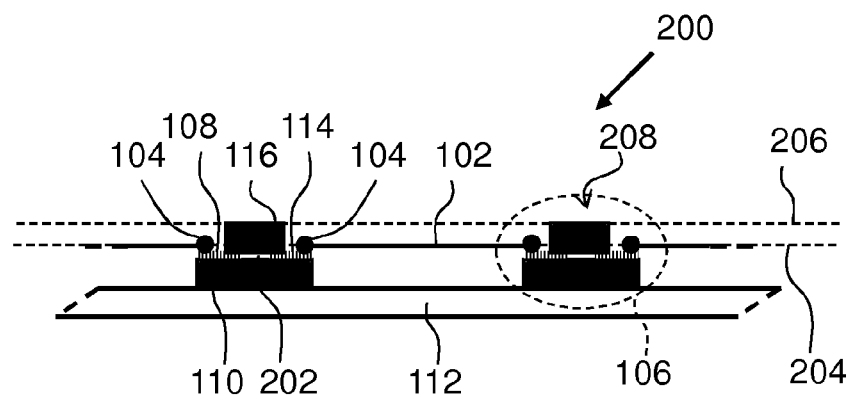

FIG. 2a schematically shows a cross-section of a lighting assembly 200. The lighting assembly 200 has the same features and structure as the lighting assembly 100 of FIG. 1. The sub-mounts 110 of the LED assemblies are, for example, thermally coupled to the primary thermal layer 112 via reflow soldering, or alternatively, they may be thermally coupled to the primary thermal layer 112 by means of a thermally conductive adhesive. In between the first electrode 108 and the second electrode 114 and below the LED die 116 an empty space 202 is shown. This space may also be filled with a thermally conductive and electrically insulating material, to obtain a larger thermal contact interface between the LED die 116 and the sub-mount 110. Further, in FIG. 2a an imaginary line 204 is drawn through an imaginary plane formed by the wires 102. The imaginary plane and, thus, the imaginary line 204, do not intersect with the primary thermal layer 112, which means that, there is not direct contact between the wires and the primary thermal 112. Thus, the primary thermal layer 112 is not in electrical contact with any one of the electrical signals being present at one of the electrodes 108, 114. Consequently, the primary thermal layer 112 is electrically neutral and can be contacted with any type of heat sink or means for carrying away heat without the need to apply additional electrical insulation. In FIG. 2a a further imaginary line 206 is drawn which follows top surfaces 208 of the LED dies 116. The top-surfaces 208 are the surfaces of the LED dies 116 which emit, in operation, light. Lines 204 and 206 also do not intersect, which means that the wires 102 do not extend above an imaginary plane formed by the top-surfaces of the LED dies 116. Thus, the wires 102 are not present in the light emitting path and no light emission is blocked by the wires.

Figure 2B:
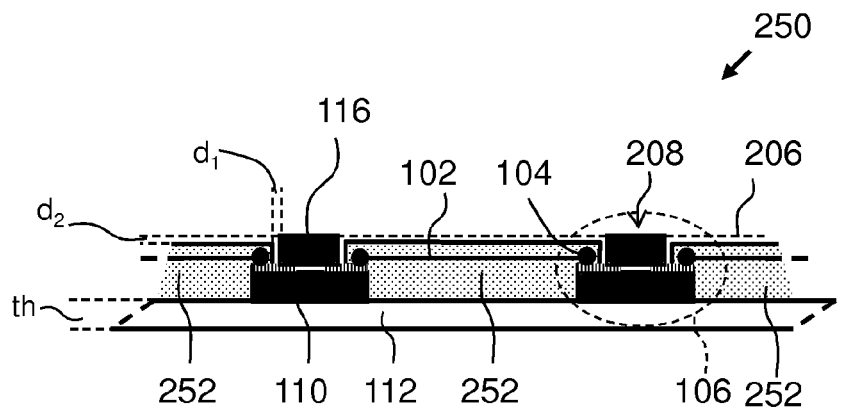

FIG. 2b schematically shows a cross-section of a lighting assembly 250. The lighting assembly 250 is similar to the lighting assembly 200, however, in between the sub-mounts 110 of the LED assemblies 106 is arranged a secondary thermal material 252. The secondary thermal material 252 encapsulates at least the wires 102 and is thermally coupled to the primary thermal layer 112. In a further embodiment, as shown, the secondary thermal material 252 also encapsulates the solder joints 104 between the wires 102 and the electrodes of the LED assemblies 106. The secondary thermal material 252 is a thermally conductive electrically insulating material. The secondary thermal material 252 provides a thermally conductive path for heat from the LED dies 116 towards the primary thermal layer 112. Thus, more heat of the LED dies 116 is conducted towards the primary thermal layer 112 and, as such, an improved cooling is provided for the LED dies 116.

As shown in FIG. 2b, a gap of a width d1 is present between the secondary thermal material 252 and the LED dies 116. The gap of size d1 has to be present because of manufacturing reasons only. The gap of size d1 is needed because of the solder wire edge to the side surface of the LED die 116. Distance d1 should be at least 200 micrometer.

In FIG. 2b the imaginary line 206 is also drawn. The imaginary line 206 is a line in an imaginary plane formed by the top surfaces 208 of the LED dies 116. The secondary thermal material 252 does not extend above the imaginary plane schematically indicated by the imaginary line 206—thus, a distance $d_2$ between the imaginary line 206 and a top surface of the secondary thermal material 252 is larger than or equal to zero. If the secondary thermal material 252 does not extend above the top surfaces 208 of the LED dies 116, the material does not block the light emission of the LED dies 116. If the secondary thermal material 252 is light transmissive (e.g. transparent or translucent), the secondary thermal material may extend above the imaginary line 206 because in that case it does not block much of the light emission.

In an embodiment, the secondary thermal material is a Silicone filled with thermally conductive particles. In a further embodiment, the thermally conductive particles are Boron Nitride particles. The size of the Boron Nitride particles shall be within the range from 400 nanometer up to 5 micrometer and the weight percentage of Boron Nitride particles in the secondary thermal material shall be in the range of 25 to 35 wt %. Boron Nitride particles have a white appearance and, consequently, they reflect light from the LED dies which impinges on the material. The Boron Nitride particles contribute to the optical efficiency of the lighting assembly. A Silicone filled with Boron Nitride particles is further a relatively good thermal black body, which means that it radiates heat in the form of infrared radiation when it becomes warm. Thus, the secondary thermal material 252 does not only provide a heat conductive path to the primary thermal layer 112, but also transfers heat to the ambient of the lighting assembly 250.

In another embodiment, the thermal conductive particles comprise hexagonal Boron Nitride, Alumina ($Al_2O_3$), ZnO or $TiO_2$.

The primary thermal layer 112 may be a layer of copper. The thickness of the layer is indicated with th. The primary thermal layer 112 should be thicker than 70 micrometer to be able to conduct sufficient heat away from the LED assemblies 106. In a specific embodiment, the primary thermal layer 112 should not be thicker than one millimeter. If the primary thermal layer 112 is of copper and has a relatively small thickness, it is flexible to a certain extent. If, in that same specific embodiment, the secondary thermal material is of Silicone with thermally conductive particles, the lighting assembly as a whole is relatively flexible and can be used in applications wherein a curved surface emits light.

Figure 3:
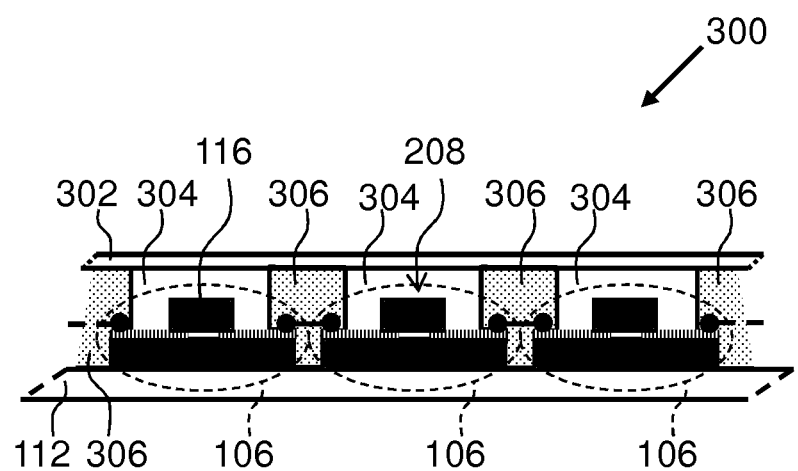

FIG. 3 schematically shows a cross-section of a lighting assembly 300. The lighting assembly 300 is similar to the lighting assembly 250 of FIG. 2b, however, the secondary thermal material 306 extends beyond an imaginary plane formed by the top surfaces 208 of the LED dies 116. In this configuration, the secondary thermal material 306 forms walls of cavities 304 which comprise the LED dies 116. In an advantageous embodiment, the secondary thermal material 306 is, such that it reflects light that impinges on the walls of the cavity 304. The cavities 304 have a light exit window, and at the light exit window a specific optical layer 302 may be provided. The specific optical layer 302 is, for example, a diffusing layer, a color filter, a layer with micro-collimators, or, for example, a layer which comprises a luminescent material. The luminescent material absorbs a portion of the light received from the LED dies and converts a portion of the absorbed light towards light of another color.

Figure 4:
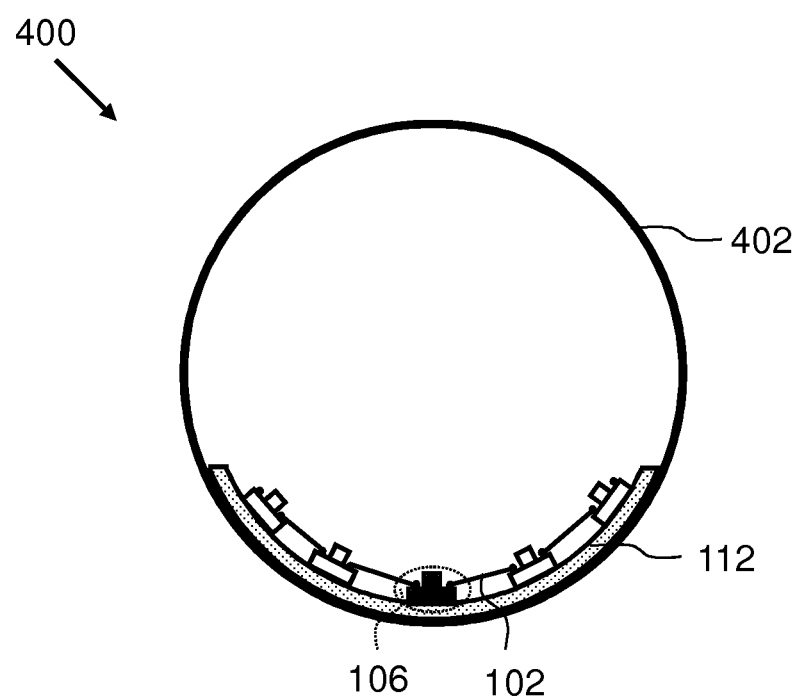

FIG. 4 schematically shows a cross-section of a light source 400 according to the second aspect of the invention. The light source 400 comprises a light transmitting tube 402 of which a cross-section is presented in FIG. 4. A lighting assembly according to the first aspect of the invention is provided within the tube 402 on a portion of the inner surface of the tube 402. The primary thermal layer 112 is brought into contact with the tube 402 such that the tube may act as a heat sink. The primary thermal layer 112 is flexible and may, as such, follow the curved shape of the tube 402. The wires 102 in between the LED assemblies may also be bent. The tube 402 is light transmitting, which means that it may be transparent or translucent.

It is to be noted that the shape of the light source 400 is not limited to the presented shape of the light transmitting tube 402. In other embodiment of the light source 400, the light source comprises, for example, a traditional light bulb.

Figure 5:
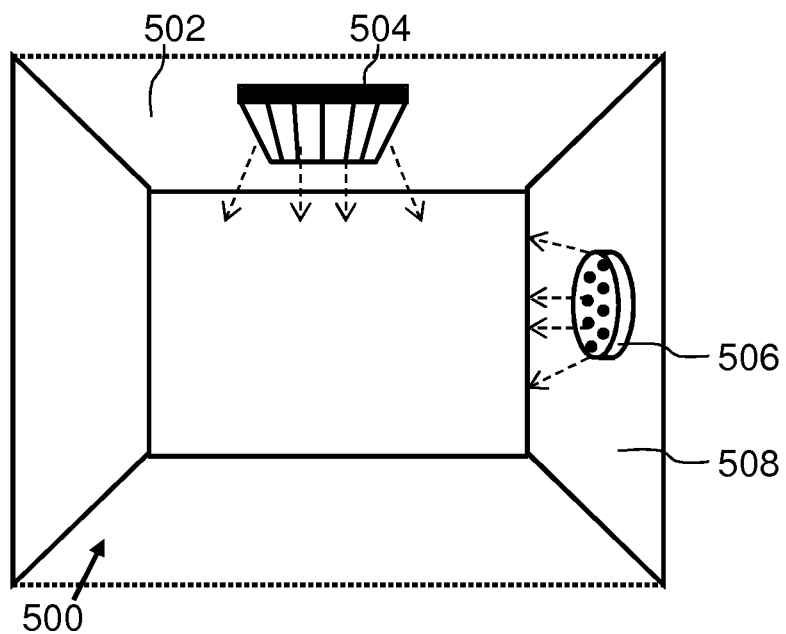

FIG. 5 schematically shows an interior 500 of a room comprising two luminaires according to the third aspect of the invention. At a ceiling 502 a rectangular luminaire 504 is schematically presented which comprises, for example, a plurality of light sources 400 as depicted in FIG. 4. At a wall 508 a circular luminaire 506 is schematically drawn which comprises, for example, the lighting assembly 250 of FIG. 2b. If the lighting assembly 250 is arranged in a luminaire 506, the primary thermal layer 112 may be brought in contact with the materials of the luminaire 506 such that the luminaire 506 acts as a heat sink.

It should be noted that the above-mentioned embodiments illustrate rather than limit the invention, and that those skilled in the art will be able to design many alternative embodiments without departing from the scope of the appended claims.

In the claims, any reference signs placed between parentheses shall not be construed as limiting the claim. Use of the verb "comprise" and its conjugations does not exclude the presence of elements or steps other than those stated in a claim. The article "a" or "an" preceding an element does not exclude the presence of a plurality of such elements. The invention may be implemented by means of hardware comprising several distinct elements. In the device claim enumerating several means, several of these means may be embodied by one and the same item of hardware. The mere fact that certain measures are recited in mutually different dependent claims does not indicate that a combination of these measures cannot be used to advantage.

The invention claimed is:

1. A lighting assembly comprising:
   a primary thermal layer of a thermally conductive material, a plurality of Light Emitting Diode assemblies, and
   a plurality of wires being electrically coupled between electrodes of at least two different Light Emitting Diode assemblies, wherein each of the Light Emitting Diode assemblies comprises:
   a sub-mount being made of a thermally conductive and electrically insulating ceramic, the sub-mount having a first side being thermally coupled to the primary thermal layer and a second side being opposite the first side,
   a first and a second metal electrode arranged at the second side of the sub-mount,
   a Light Emitting Diode die, an anode of the Light Emitting Diode die being electrically coupled to the first metal electrode and a cathode of the Light Emitting Diode die being electrically coupled to the second metal electrode, each Light Emitting Diode die comprising a top surface being configured to emit light, at least one side surface, and a bottom surface; and
   a secondary thermal material being thermally conductive and electrically insulating and being thermally coupled to the primary thermal layer, the secondary thermal material being arranged in between at least a subset of neighboring ones of the Light Emitting Diode assemblies for encapsulating all of the plurality of wires and extending only up to an imaginary plane formed by top surfaces of the Light Emitting Diode dies and forming walls of cavities comprising the Light Emitting Diode dies, such that the secondary thermal directly receives and conducts to the sub-mount, heat generated by the at least one side surface of each of the subset of neighboring ones of the Light Emitting Diode dies.

2. A lighting assembly according to claim 1, wherein the wires are arranged in a plane, wherein the plane does not intersect with the primary thermal layer.

3. A lighting assembly according to claim 1, wherein the secondary thermal material comprises Silicone filled with thermally conductive electrically insulating particles.

4. A lighting assembly according to claim 3, wherein the thermally conductive electrically insulating particles comprise at least one of Boron Nitride, hexagonal Boron Nitride, Al2O3, ZnO and TiO2 particles.

5. A lighting assembly according to claim 1, wherein the primary thermal layer comprises copper and the electrodes comprise copper.

6. A lighting assembly according to claim 1, wherein the primary thermal layer is flexible.

7. A lighting assembly according to claim 1, wherein the primary thermal layer is thicker than 70 micrometer.

8. A lighting assembly according to claim 1, wherein the Light Emitting Diode die is a flip-chip Light Emitting Diode die having the anode and the cathode at a surface of the Light Emitting Diode die and being arranged with the surface towards the electrodes.

9. A lighting assembly according to claim 1, wherein the sub-mount comprises Aluminium Oxide or Aluminium Nitride.

10. A light source comprising the lighting assembly according to claim 1.

11. A light source according to claim 10, wherein the lighting assembly is arranged inside a light transmitting tube.

12. A luminaire comprising the lighting assembly according to claim 1, or comprising the light source.

13. A lighting assembly according to claim 1, wherein the cavities have a light exit window at which an optical layer is provided.

* * * * *